United States Patent

Koo

[11] Patent Number: 6,034,387
[45] Date of Patent: Mar. 7, 2000

[54] METHODS OF OPERATING FERROELECTRIC MEMORY DEVICES HAVING LINEAR REFERENCE CELLS THEREIN

[75] Inventor: Bon-jae Koo, Incheon, Rep. of Korea

[73] Assignee: Samsung Electronics Co., Ltd., Rep. of Korea

[21] Appl. No.: 09/395,544

[22] Filed: Sep. 14, 1999

Related U.S. Application Data

[62] Division of application No. 09/098,485, Jun. 16, 1998, Pat. No. 5,969,982.

[30] Foreign Application Priority Data

Jun. 17, 1997 [KR] Rep. of Korea ........................ 97-25216

[51] Int. Cl.⁷ .................................................. H01L 27/108
[52] U.S. Cl. ........................................... 257/295; 257/296
[58] Field of Search ......................... 257/295, 296; 365/145, 149

[56] References Cited

U.S. PATENT DOCUMENTS

| | | | |
|---|---|---|---|
| 4,873,664 | 10/1989 | Eaton, Jr. ................................. | 365/145 |
| 5,373,463 | 12/1994 | Jones, Jr. ................................ | 365/145 |
| 5,608,667 | 3/1997 | Osawa ..................................... | 365/145 |
| 5,640,030 | 6/1997 | Kenney .................................... | 257/296 |
| 5,737,260 | 4/1998 | Takata et al. ............................ | 365/145 |
| 5,751,626 | 5/1998 | Seyyedy ................................... | 365/145 |
| 5,959,922 | 9/1999 | Jung ........................................ | 365/145 |
| 5,969,380 | 10/1999 | Seyyedy ................................... | 257/295 |
| 5,978,250 | 11/1999 | Chung et al. ............................ | 365/145 |

*Primary Examiner*—Trong Phan
*Attorney, Agent, or Firm*—Myers Bigel Sibley & Sajovec

[57] ABSTRACT

Nonvolatile ferroelectric-based integrated circuit memory devices utilize reference cells containing linear storage capacitors to inhibit deterioration in reliability typically associated with ferroelectric capacitors which have undergone excessive polarization cycling. These linear storage capacitors are preferably coupled to respective plate lines so that efficient reading operations may be performed. In particular, a nonvolatile memory device is preferably provided which contains a ferroelectric memory cell having an access transistor and a ferroelectric storage capacitor therein. A reference cell is also provided and this reference cell contains an access transistor and a linear storage capacitor therein. In addition, a sense amplifier is provided which has first and second inputs electrically coupled to the access transistors of the ferroelectric memory cell and the reference cell, respectively. To improve the efficiency of reading operations, a reset transistor is preferably provided and this transistor is electrically connected in series between the second input of the sense amplifier and a reference signal line (e.g., ground signal line).

3 Claims, 4 Drawing Sheets

METHODS OF OPERATING FERROELECTRIC MEMORY DEVICES HAVING LINEAR REFERENCE CELLS THEREIN

This application is a Division of Ser. No. 09/098,485 filed Jun. 16, 1998 now U.S. Pat. No. 5,969,982.

FIELD OF THE INVENTION

The present invention relates to integrated circuit memory devices, and more particularly to nonvolatile integrated circuit memory devices having ferroelectric memory cells therein and methods of operating same.

BACKGROUND OF THE INVENTION

Ferroelectric random access memory (FRAM) devices are "nonvolatile" memory devices because they preserve data stored therein even in the absence of a power supply signal. Each memory cell includes a capacitor which comprises two conductive electrodes and a ferroelectric material layer formed therebetween. The ferroelectric materials used for the ferroelectric capacitor are typically Phase III potassium nitrate, bismuth titanate and lead zirconate titanate Pb(Zr, Ti)$O_3$ (PZT). Ferroelectric materials have hysteresis characteristics. Thus, the polarity of the ferroelectric material can be maintained even after interruption of the power supply. Data (e.g., logic 0,1) is stored in the FRAM as the polarity state of the ferroelectric material in each capacitor.

The typical hysteresis characteristics of ferroelectric material will be described in detail with reference to FIG. 1. In FIG. 1, the abscissa represents a voltage V applied across the electrodes of the ferroelectric capacitor, and the ordinate represents the polarization state of the ferroelectric material. When positive and negative voltages are consecutively applied across the ferroelectric material, the polarization state of the ferroelectric material will trace a continuous loop. For example, when a predetermined positive voltage is applied across the ferroelectric material, a maximum positive polarization of +Pm at point B may be reached. When the positive voltage is removed, the degree of polarization may be reduced somewhat to +Pr at point C which denotes the residual positive polarization. Then, when a predetermined negative voltage is applied across the ferroelectric material, a maximum negative polarization of −Pm at point D may be reached. When the negative voltage is then removed, the magnitude of the degree of polarization is reduced to −Pr at point A which denotes the residual negative polarization. It is these residual polarization states which render an FRAM device as a nonvolatile device.

The polarization switching speed of a ferroelectric capacitor is approximately $10^{-9}$ sec. and the necessary program time of a ferroelectric capacitor is typically shorter than that of other nonvolatile memory devices such as electrically programmable read only memory (EPROM) devices, electrically erasable and programmable read only memory (EEPROM) devices and flash memory devices. As will be understood by those skilled in the art, the read/write cycle endurance of a ferroelectric capacitor is typically on the order of $10^9$ to $10^{12}$.

In conventional ferroelectric memory devices, ferroelectric-based dummy cells may be used to facilitate reading operations. The use of dummy cells is more fully described in U.S. Pat. No. 4,873,664 to Eaton, Jr. entitled "Self Restoring Ferroelectric Memory". U.S. Pat. Nos. 5,640,030, 5,373,463 and 5,608,667 also disclose ferroelectric memory devices which, in the case of the '030 patent, may contain reference cells (which are not responsive to plate line biases) to facilitate reading operations.

Unfortunately, the ferroelectric-based dummy cells contained in the memory devices of the '664 patent may undergo an exceptionally large number of repeated reading cycles and polarization reversal cycles because each dummy cell undergoes multiple cycles for every cycle a real memory cell undergoes. Thus, a reduction in the reliability of the memory devices of the '664 patent may be experienced if the cycle endurance of a dummy cell contained therein is exceeded.

Accordingly, notwithstanding the above-described nonvolatile memory devices which utilize ferroelectric materials, there continues to be a need for improved nonvolatile memory devices.

SUMMARY OF THE INVENTION

It is therefore an object of the present invention to provide improved nonvolatile integrated circuit memory devices and methods of operating and forming same.

It is another object of the present invention to provide nonvolatile integrated circuit memory devices having improved reliability and methods of operating and forming same.

These and other objects, advantages and features of the present invention are provided by nonvolatile ferroelectric-based integrated circuit memory devices which utilize reference cells containing linear storage capacitors to inhibit deterioration in reliability typically associated with ferroelectric capacitors which have undergone excessive polarization cycling. These linear storage capacitors are preferably coupled to respective plate lines so that efficient reading operations may be performed. In particular, a nonvolatile memory device is preferably provided which contains a ferroelectric memory cell having an access transistor and a ferroelectric storage capacitor therein. A reference cell is also provided and this reference cell contains an access transistor and a linear storage capacitor therein, In addition, a sense amplifier is provided which has first and second inputs electrically coupled to the access transistors of the ferroelectric memory cell and the reference cell, respectively, by a bit line and reference bit line. To improve the efficiency of reading operations, a reset transistor is preferably provided and this transistor is electrically connected in series between the second input of the sense amplifier and a reference signal line (e.g., ground signal line).

A preferred method also includes the steps of discharging a linear storage capacitor in the reference cell and then driving the bit line to a first potential by electrically connecting a storage electrode of a ferroelectric capacitor in the ferroelectric memory cell to the bit line while simultaneously driving a plate electrode of the ferroelectric storage capacitor to a first plate potential. Simultaneously with this driving step, another step is performed to drive the reference bit line to a second potential by electrically connecting a storage electrode of the discharged linear storage capacitor in the linear reference cell to the reference bit line while simultaneously driving a plate electrode of the discharged linear storage capacitor to a second plate potential. The sense amplifier then drives the bit line and reference bit line to respective opposite potentials by sensing and amplifying a difference in potential between the bit line and reference bit line.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
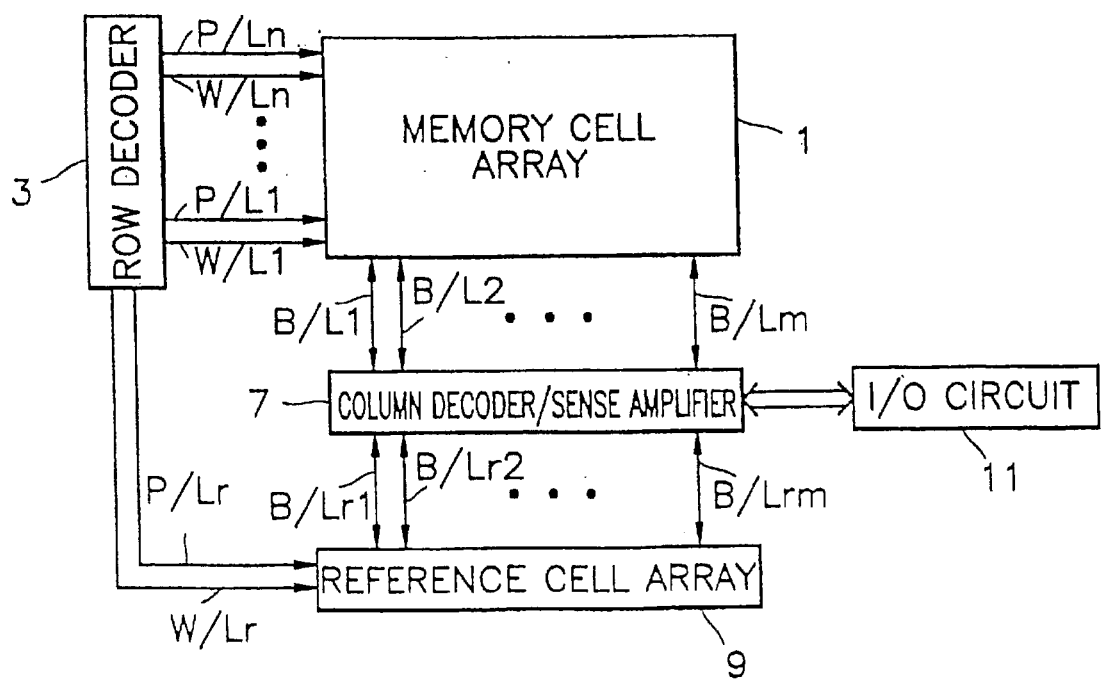
FIG. 2 is a block diagram of an integrated circuit memory device according to an embodiment of the present invention.

Referring now to FIG. 2, a ferroelectric memory device may include a memory cell array 1 containing a plurality of memory cells arranged as a two-dimensional matrix of memory cells and a reference cell array 9 containing a plurality of reference cells which can generate information for comparison with information stored in the memory cell array 1. A row decoder 3 and column decoder 7 are also provided which generate a row address signal and a column address signal, respectively. These decoders enable selection of desired memory cells and desired reference cells. Here, the row decoder 3 controls word lines W/L1, . . . , W/Ln which are electrically coupled to the memory cells and a reference word line W/Lr which is electrically coupled to the reference cells. A column decoder 7 is also provided which controls bit lines B/L1, . . . , B/Lm of the memory cells and reference bit lines B/Lr1, . . . , B/Lrm of the reference cells, The row decoder 3 also controls plate lines P/L1, . . . , P/Ln which are electrically coupled to the memory cells and a reference plate line P/Lr which is electrically coupled to the reference cells.

The bit lines of the memory cell array 1 and reference bit lines of the reference cell array 9 are also connected to a sense amplifier 7. Here, the reference numeral 7 denotes both a sense amplifier and column decoder, as illustrated. The sense amplifier 7 may have a plurality of pairs of inputs, with each pair of inputs being provided for a respective bit line (B/L1–B/Lm) connected to the memory cell array 1 and a respective reference bit line (B/Lr1–B/Lrm) connected to the reference cell array 9. As will be understood by those skilled in the art, the sense amplifier 7 may perform the function of sensing and amplifying a voltage difference between the two inputs of each pair and then outputting a signal which represents the value of data stored in a selected memory cell to an input/output circuit 11. The operation of the sense amplifier 7 may be as described in U.S. Pat. No. 5,701,268, assigned to the present assignee, the disclosure of which is hereby incorporated herein by reference.

Figure 3:
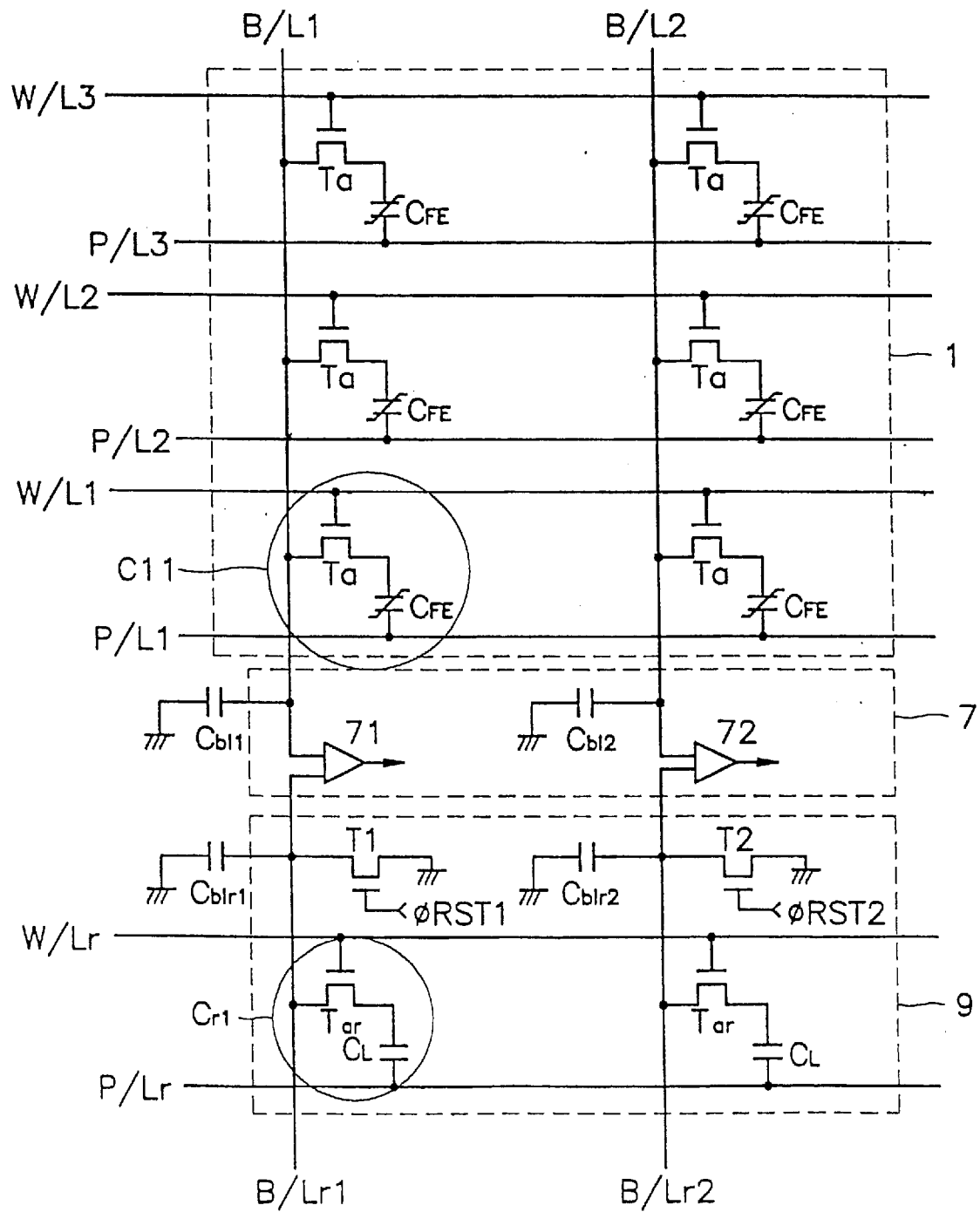
FIG. 3 is an electrical schematic of an integrated circuit memory device according to an embodiment of the present invention.

Referring now to FIG. 3, an electrical schematic of a preferred integrated circuit memory device according to an embodiment of the present invention is illustrated. This integrated circuit memory device includes a memory cell array 1 containing ferroelectric memory cells therein (e.g., $C_{11}$), a preferred reference cell array 9 containing linear reference cells ($C_r1$) therein and a column decoder/sense amplifier 7. Each of the memory cells of the memory cell array 1 may include one access transistor Ta and one ferroelectric capacitor $C_{FE}$. The drain region (or source region) of each access transistor Ta is connected to a storage electrode of a respective ferroelectric capacitor $C_{FE}$. Also, the gate electrode of each access transistor Ta and the source region (or the drain region) of each access transistor Ta are connected to a corresponding word line (W/L1, . . . , W/Ln) and a corresponding bit line (B/L1, . . . , B/Lm), respectively. The plate electrode of each ferroelectric capacitor $C_{FE}$ is also connected to a corresponding plate line (P/L1, . . . , P/Ln).

According to a preferred aspect of the present invention, each of the reference cells of the reference cell array 9 includes an access transistor Tar and a linear (e.g., non-ferroelectric) capacitor $C_L$. The drain region (or source region) of each access transistor Tar of a reference cell is connected to the storage electrode of a respective linear capacitor $C_L$. In addition, the gate electrode of each access transistor Tar and the source region (or the drain region) thereof are connected to a corresponding reference cell word line W/Lr and a reference cell bit line (B/Lr1, . . . , B/Lrm), respectively. The plate electrode of each linear capacitor $C_L$ is electrically connected to the reference cell plate line P/Lr. Here, the term "linear capacitor" refers to a capacitor which comprises a non-ferroelectric dielectric material between its two opposing electrodes.

The column decoder/sense amplifier 7 includes a plurality of sense amplifier stages. As illustrated, the two inputs of the first sense amplifier stage 71 are connected to the first bit line B/L1 and the first reference bit line B/Lr1. Similarly, the two inputs of the second sense amplifier stage 72 are connected to the second bit line B/L2 and the second reference bit line B/Lr2. According to another preferred aspect of the present invention, a first reset MOS transistor T1 is connected in series between the first reference bit line B/Lr1 and a reference potential (GND) and a second reset MOS transistor T2 is connected in series between the second reference bit line B/Lr2 and the reference potential, as illustrated. The gate electrode of each reset MOS transistor is electrically connected to a respective reset signal line (e.g., RST1, RST2). Here, the application of a positive pulse to a reset signal line can be used to pull a corresponding reference bit line (e.g., B/Lr1, B/Lr2) to the reference potential to discharge it and also discharge (i.e., reset) a corresponding linear capacitor C, when the corresponding reference access transistor Tar is turned-on. In FIG. 3, reference character $C_{bl1}$ denotes the capacitance of the first bit line B/L1 and reference character $C_{blr1}$ denotes the capacitance of the first reference bit line B/Lr1. Also, reference character $C_{bl2}$ denotes the capacitance of the second bit line B/L2 and reference character $C_{blr2}$ denotes the capacitance of the second reference bit line B/Lr2.

Figure 4:
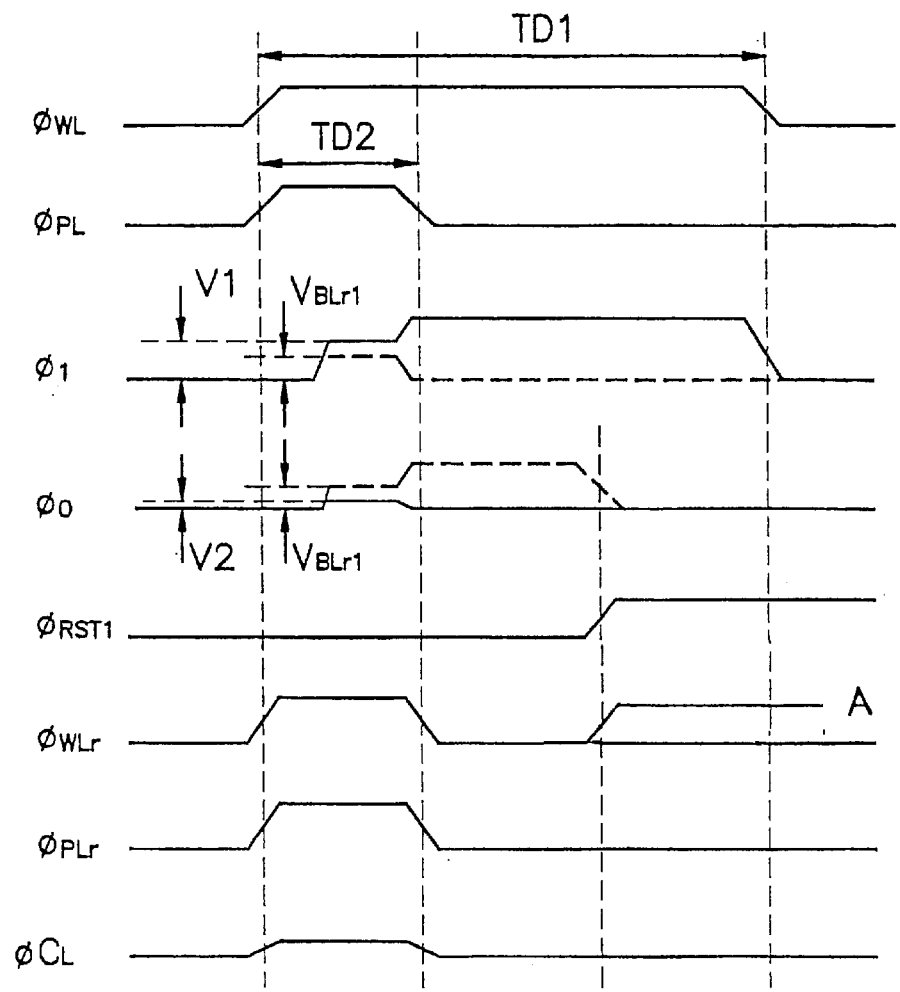
FIG. 4 is a timing diagram which illustrates operation of the memory device of FIG. 3.

Referring now to FIG. 4, a timing diagram is provided which illustrates operation of the integrated circuit memory device of FIG. 3 when data in the memory cell Cl I is being read. In FIG. 4, the symbol ΦWL denotes the potential of the first word line W/L1, the symbol ΦPL denotes the potential of the first plate line P/L1, the symbol ΦPLr denotes the potential of the reference plate line P/Lr, the symbol Φ1 denotes the potentials of the first bit line B/L1 and first reference bit line B/Lr1 during a read operation when the data in the memory cell C11 is at a logic 1 potential, the symbol 00 denotes the potentials of the first bit line B/L1 and first reference bit line B/Lr1 during a read operation when the data in the memory cell C11 is at a logic 0 potential, the symbol ΦRST1 denotes the potential of the first reset signal line, the symbol ΦWLr denotes the potential of the reference word line W/Lr and the symbol ΦC$_L$ denotes the potential, across the linear capacitor C$_L$.

During the reading operation, the first bit line B/L1 and the corresponding first reference bit line B/Lr1 are set to a predetermined voltage, for example, 0 V. Then, a pulse signal ΦWL (having a first width TD1) is applied to the first word line W/L1 and a pulse signal ΦWLr is applied to the reference word line W/Lr. These pulse signals operate to turn on the access transistor Ta of the first memory cell C$_{11}$ and turn on the access transistor Tar of the first linear reference cell Cr1. In addition, a plate line pulse signal ΦPL (having a second width TD2) and a reference plate line pulse signal ΦPlr are applied to the first plate line P/L1 and the first reference plate line P/Lr, respectively, at the same time the signal ΦWL is applied to the first word line W/L1 and the signal ΦWLr is applied to the reference word line W/Lr.

Figure 1:
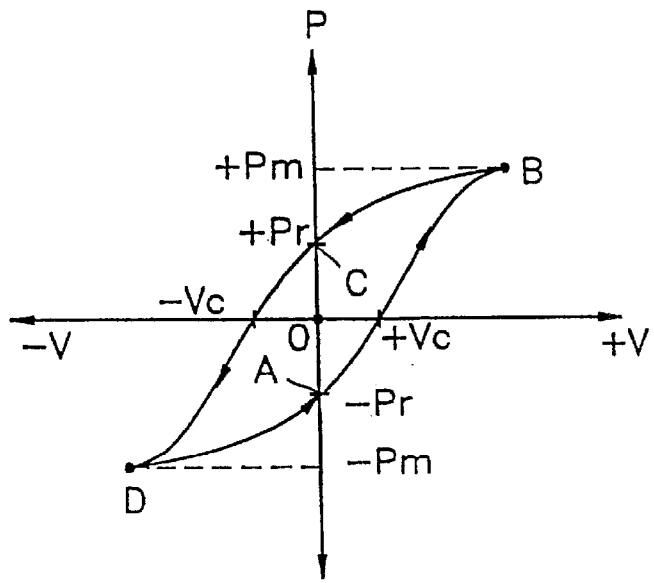
FIG. 1 is hysteresis curve illustrating polarization characteristics of a ferroelectric capacitor according to the prior art.

If, during these operations, the data stored in the ferroelectric capacitor in the first memory cell C$_{11}$ is a logic 1 value because the potential between the storage electrode and plate electrode of the ferroelectric capacitor is positive (+) (see point "C" in FIG. 1), then a positive voltage V1 will be induced on the first bit line B/L1 during a read operation. Alternatively, if the data stored in the ferroelectric capacitor in the first memory cell C$_{11}$ is a logic 0 value because the potential between the storage electrode and plate electrode of the ferroelectric capacitor is negative (−) (see point "A" in FIG. 1), then a much smaller positive voltage V2 will be induced on the first bit line B/L1. According to another preferred aspect of the present invention, the linear reference capacitor C$_L$ in the first reference cell Cr1 may or may not be precharged to support a reference potential and can also be appropriately sized relative to the capacitance C$_{blr1}$ of the first reference bit line B/Lr1, so that a reading operation will also induce a voltage on the first reference bit line B/Lr1 which is at an intermediate level relative to the voltage levels V1 and V2. As will be understood by those skilled in the art, the voltage V$_{BLr1}$ induced on the first reference bit line B/Lr1 may be determined from the capacitance of the linear capacitor C$_L$ and the capacitance of the first reference bit line C$_{blr1}$, as illustrated by the following equation where Vcc represents the magnitude of the voltage applied to the reference plate line P/Lr:

$$V_{BLr1}=(Vcc \times C_L)/(C_L+C_{blr1})$$

The voltages induced on the first bit line B/L1 and the first reference bit line B/Lr1 are then sensed and amplified by a first sense amplifier stage 71. If voltage V1 is induced on the first bit line B/L1, the first bit line B/L1 will be driven to a logic 1 potential (solid line) and the first reference bit line B/Lr1 will be driver to a logic 0 potential (dotted line) by the first sense amplifier stage 71, as illustrated. Alternatively, if voltage V2 is induced on the first bit line B/L1, the first bit line B/L1 will be driven to a logic 0 potential (solid line) and the first reference bit line B/Lr1 will be driver to a logic 1 potential (dotted line) by the first sense amplifier stage 71, as illustrated. Driving the potential on the first plate line P/L1 back to a logic 0 potential at the end of time Interval TD2 (while the first word line W/L1 is still maintained at a logic 1 potential) also allows a self-restore operation to be performed so that the reading operation is nondestructive. The benefits associated with self-restore operations are more fully described in application Ser. No. 08/932,729, to Chung et al. entitled "Ferroelectric Memory Devices Having Reconfigurable Bit Lines and Methods of Operating Same"

(Attorney Docket No. 5649-350), assigned to the present assignee, the disclosure of which is hereby incorporated herein by reference. The reference word line W/Lr and reference plate line P/Lr may also be driven back to a logic 0 potential at the end of time interval TD2.

Referring still to FIG. 4, a reset operation is then preferably performed to discharge any potential on the first reference bit line B/Lr1, and prepare for the next operation. This is preferably achieved by turning on MOS transistor T1 by driving ΦRST1 to a logic 1 potential, as illustrated. As illustrated by line "A", a pulse may also be applied, if necessary, to the reference word line W/Lr when MOS transistor T1 is turned on, to further discharge any remaining potential on the linear capacitor C$_L$ in the first reference cell Cr1.

Figure 5:
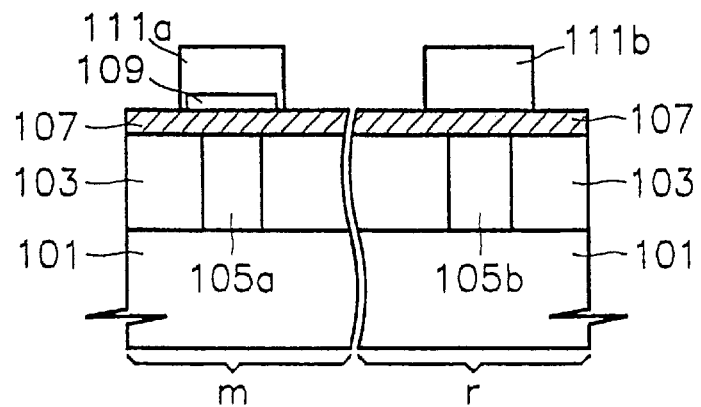
FIGS. 5–8 are cross-sectional views of intermediate structures which illustrate methods of forming ferroelectric memory devices according to the present invention.

FIGS. 5–8 are sectional views illustrating a fabrication method of forming a ferroelectric memory device according to the present invention. Here, reference characters "m" and "r" indicate a memory cell array region and a reference cell array region, respectively, FIG. 5 is a sectional view illustrating a step of forming a first conductive layer 107 and a ferroelectric layer pattern 109. First, a lower interdielectric layer is formed on a semiconductor substrate 101, and then the lower interdielectric layer is patterned, to thereby form a lower interdielectric layer pattern 103 having first and second storage contact holes which expose a predetermined region of the semiconductor substrate 101. The first storage contact hole is formed in the memory cell array region "m", and the second storage contact hole is formed on the reference cell array region "r". The region of the semiconductor substrate 101 exposed by the first storage contact hole corresponds to a drain region of an access transistor (not shown) of the memory cell, and the region of the semiconductor substrate 101 exposed by the second storage contact hole corresponds to a drain region of an access transistor (not shown) of the reference cell.

Next, a memory cell plug pattern 105a for filling the first storage contact hole, and a reference cell plug pattern 105b for filling the second storage contact hole, are formed. The plug patterns 105a and 105b may be formed of a tungsten layer or a doped polysilicon layer. Then, a first conductive layer 107 (i.e., a platinum layer having excellent oxidation-resistance) is formed on the entire surface of the resultant structure where the plug patterns 105a and 105b are also formed. Subsequently, a ferroelectric layer (i.e., a PZT layer) is formed on the first conductive layer 107, and then the ferroelectric layer is patterned, to thereby form a ferroelectric layer pattern 109 above the memory cell plug pattern 105a. A first photoresist pattern 111a for covering the ferroelectric layer pattern 109, and a second photoresist pattern 111b for covering the first conductive layer 107 on the reference cell plug pattern 105b, are formed.

Figure 6:
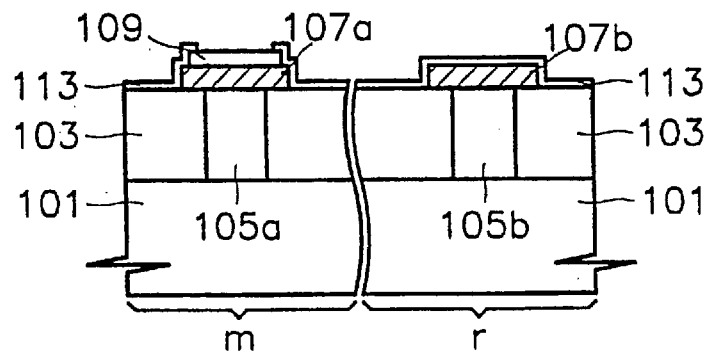

FIG. 6 is a sectional view illustrating a step of forming a memory cell storage electrode 107a, a reference cell storage electrode 107b and a diffusion barrier layer pattern 113. In detail, the first conductive layer 107 is etched using the first and second photoresist patterns 111a and 111b as an etching mask, to thereby form a memory cell storage electrode 107a interposed between the memory cell plug pattern 105a and the ferroelectric layer pattern 109 and, at the same time, form the reference cell storage electrode 107b on the reference cell plug pattern 105b. The first and second photoresist patterns 111a and 111b are removed, and then a diffusion barrier layer (i.e., a titanium oxide layer TiO$_2$) is formed on the entire surface of the resultant structure. Then, the diffusion barrier layer is patterned, to form a diffusion barrier layer pattern 113 exposing the ferroelectric layer pattern

109. The diffusion barrier layer pattern 113 is used as the dielectric layer of the reference cell capacitor. Also, the diffusion barrier layer pattern 113 prevents the ferroelectric layer pattern 109 of the memory cell capacitor from contacting and reacting with an upper interdielectric layer formed in a subsequent process. As a result, the ferroelectric layer pattern 109 can be protected from deterioration.

Figure 7:
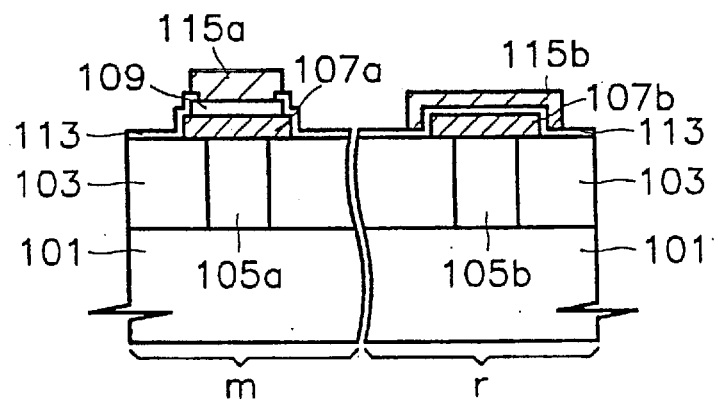

FIG. 7 is a sectional view illustrating a step of forming a memory cell plate electrode 115*a* and a reference cell plate electrode 115*b*. In detail, a second conductive layer having excellent oxidation-resistance (i.e., a platinum layer) is formed on the entire surface of the resultant structure where the diffusion barrier layer pattern 113 is formed, and then the second conductive layer is patterned, to thereby form the memory cell plate electrode 115*a*, which covers the exposed ferroelectric layer pattern 109. The reference cell plate electrode 115*b* also covers the diffusion barrier layer pattern 113 on the reference cell storage electrode 107*b*. When the memory cell plate electrode 115*a* and the reference cell plate electrode 115*b* are for med, a ferroelectric capacitor is formed on the memory cell array "m", and a linear capacitor is formed on the reference cell array "r".

Figure 8:
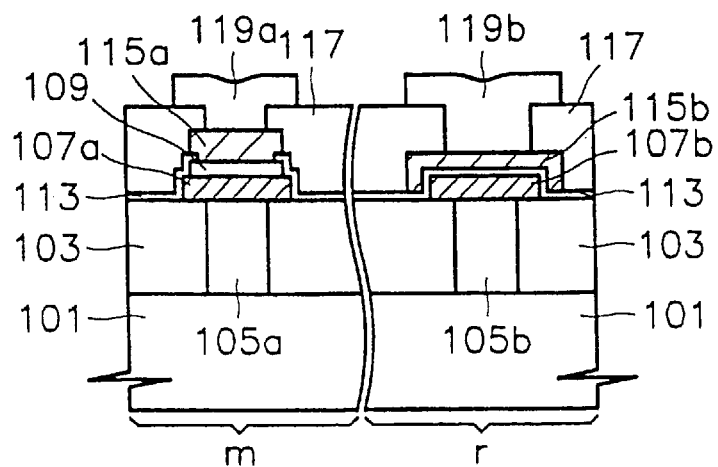

FIG. 8 is a sectional view illustrating a step of forming a memory cell plate line 119*a* and a reference cell plate line 119*b*. In detail, an upper interdielectric layer is formed on the entire surface of the resultant structure where the plate electrodes 115*a* and 115*b* are formed, and then the upper interdielectric layer is patterned, to thereby form an upper interdielectric layer pattern 117 which exposes the memory cell plate electrode 115*a* and the reference cell plate electrode 115*b*. Then, a conductive layer such as a metal layer is formed on the entire surface of the resultant structure where the upper interdielectric layer pattern 117 is formed. The conductive layer is then patterned to form the memory cell plate line 119*a*, connected to the memory cell plate electrode 115*a*, and the reference cell plate line 119*b* connected to the reference cell plate electrode 115*b*.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a ferroelectric memory device having a memory cell array and a reference cell array, comprising steps of:

a) forming a memory cell storage electrode and a ferroelectric layer pattern on a predetermined region of the memory cell array, and at the same time forming a reference cell storage electrode on a predetermined region of the reference cell array;

b) forming a dielectric layer pattern exposing the ferroelectric layer pattern; and c) forming a memory cell plate electrode covering the exposed ferroelectric layer pattern, and a reference cell plate electrode covering the dielectric layer on the reference cell storage electrode.

2. The method of claim 18, wherein step a) comprises:

a1) sequentially forming a first conductive layer and a ferroelectric layer on a semiconductor substrate;

a2) patterning the ferroelectric layer, to form a ferroelectric layer pattern on a predetermined region of the first conductive layer of the memory cell array;

a3) forming a first photoresist pattern covering the ferroelectric layer pattern, and a second photoresist pattern covering a predetermined region of the first conductive layer of the reference cell array;

a4) etching the first conductive layer using the first and second photoresist patterns as an etching mask, to form a memory cell storage electrode and a reference cell storage electrode under the ferroelectric layer pattern and the second photoresist pattern, respectively; and a5) removing the first and second photoresist patterns.

3. The method of claim 19, wherein the first conductive layer comprises platinum.

\* \* \* \* \*

UNITED STATES PATENT AND TRADEMARK OFFICE
CERTIFICATE OF CORRECTION

PATENT NO. : 6,034,387
DATED : March 7, 2000
INVENTOR(S) : Bon-jae Koo

It is certified that error appears in the above-identified patent and that said Letters Patent is hereby corrected as shown below:

Column 8, line 20, please delete "18" and substitute -- 1 -- therefor.
Column 8, line 37, please delete "19" and substitute -- 2 -- therefor.

Signed and Sealed this

Sixth Day of March, 2001

Attest:

NICHOLAS P. GODICI

Attesting Officer

Acting Director of the United States Patent and Trademark Office